United States Patent
Gill (10) Patent No.: US 9,575,338 B2
(45) Date of Patent: Feb. 21, 2017

(54) CONTROLLED-CAPACITANCE FULL-DEPLETION INTERDIGITATED PIN MODULATOR

(71) Applicant: International Business Machines Corporation, Armonk, NY (US)

(72) Inventor: Douglas M. Gill, South Orange, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/642,924

(22) Filed: Mar. 10, 2015

(65) Prior Publication Data

US 2016/0266464 A1    Sep. 15, 2016

(51) Int. Cl.
| | |
|---|---|
| G02F 1/025 | (2006.01) |
| G02F 1/225 | (2006.01) |
| G02F 1/21 | (2006.01) |
| H01L 31/18 | (2006.01) |

(52) U.S. Cl.
CPC ............ *G02F 1/025* (2013.01); *G02F 1/2257* (2013.01); *H01L 31/18* (2013.01); *G02F 2001/212* (2013.01)

(58) Field of Classification Search
CPC .. G02F 1/011; G02F 1/015; G02F 2001/0151; G02F 2001/0154; G02F 1/01708; G02F 1/025; G02F 1/03; G02F 1/035; G02F 1/0356; G02F 1/21; G02F 2001/212; G02F 1/225; G02F 1/2255; G02F 1/2257
See application file for complete search history.

(56) References Cited

U.S. PATENT DOCUMENTS

| | | | |
|---|---|---|---|
| 6,912,079 | B2 | 6/2005 | Liu |
| 7,136,544 | B1 | 11/2006 | Gunn, III et al. |
| 8,525,264 | B1 | 9/2013 | Assefa et al. |
| 8,526,090 | B1 | 9/2013 | Green et al. |
| 9,140,957 | B2 * | 9/2015 | Velthaus ............... G02F 1/2255 |
| 9,195,112 | B2 * | 11/2015 | Meister .................. G02F 1/025 |
| 2009/0263078 | A1 | 10/2009 | Hosomi et al. |

OTHER PUBLICATIONS

List of IBM Patents or Patent Applications Treated as Related; (Appendix P), Filed Jul. 9, 2015; 2 pages.

(Continued)

*Primary Examiner* — John M Bedtelyon
(74) *Attorney, Agent, or Firm* — Cantor Colburn LLP; Vazken Alexanian (57) ABSTRACT

A method of modulating an optical input with a radio frequency (RF) signal, an interdigitated modulator, and an electro-optical modulator including the interdigitated modulator are described. The method includes splitting the optical input to a first optical input and a second optical input, traversing a first region and a second region, respectively, with the first optical input and the second optical input, and modulating the first optical input with the RF signal in the first region. The method also includes controlling propagation speed of the RF signal in the first region, controlling RF line impedance in the first region, and controlling an optical loss of the first optical input in the first region.

10 Claims, 8 Drawing Sheets

(56) References Cited

OTHER PUBLICATIONS

Douglas M. Gill, "Controlled-Capacitance Full-Depletion Interdigitated Pin Modulator", U.S. Appl. No. 14/744,544, filed Jun. 19, 2015.
Feng et al., "High speed carrier-depletion modulators with 1.4V-cm VπL integrated on 0.25μm silicon-on-insulator waveguides," Optics Express, vol. 18, Issue 8, 2010, pp. 7994-7999.
Goykhman et al., "Optimization of efficiency-loss figure of merit in carrier-depletion silicon Mach-Zehnder optical modulator", Optics Expess, vol. 21, No. 17, Aug. 26, 2013, pp. 1-12.
Li et al., "Silicon waveguide modulator based on carrier depletion in periodically interleaved PN junctions," Optics Express, vol. 17, Issue 18, 2009, pp. 15947-15958.
Rosenberg et al., "A 25 Gbps silicon microring modulator based on an interleaved junction", Optics Express, vol. 20, No. 24, 2012, pp. 26411-26423.
Watts et al., "Low-Voltage, Compact, Depletion-Mode, Silicon Mach—Zehnder Modulator", IEEE Journal of Selected Topics in Quantum Electronics, vol. 16, No. 1, Jan./Feb. 2010, pp. 159-164.
Ziebell et al., "Ten Gbit/s ring resonator silicon modulator based on interdigitated PN junctions", Optics Express, vol. 19, Issue 15, 2011, pp. 14690-14695.
GB Search and Examination Report for GB Application No. 1603607.1, dated Aug. 23, 2016, pp. 1-7.
Ku et al., "High speed silicon Mach-Zehnder modulator based on interleaved PN junctions", Optics Express, vol. 20, No. 14, Jul. 2, 2012, pp. 1-8.
Yu et al., "Silicon Carrier-Depletion-Based Mach-Zehnder and Ring Modulators with Different Doping Patterns for Telecommunication and Optical Interconnect", 2012 14th International Conference on Transparent Optical Networks, 2012, pp. 1-7.

\* cited by examiner

CONTROLLED-CAPACITANCE FULL-DEPLETION INTERDIGITATED PIN MODULATOR

BACKGROUND

The present invention relates to electro-optic modulation of an optical signal to transport data, and more specifically, to a controlled-capacitance full-depletion interdigitated PIN modulator.

The transmission of data via optical signals facilitates transport over longer distances than via many other types of signals. The optical signal is generated by modulating light with the data using an electro-optic modulator (EOM) which may implement an interference process, for example. The phase, frequency, amplitude, and/or polarization of a light beam may be modulated. An exemplary electro-optic modulator that modulates amplitude of a light beam is a Mach-Zehnder interferometer (MZI). The MZI includes a beam splitter that divides light into two paths, at least one of which has a phase modulator. The light beams in the two paths are recombined, and, based on the electric field on the modulated path(s), the two beams interfere to control the amplitude or intensity of resultant light at a specific optical output of the device.

SUMMARY

According to one embodiment of the present invention, a method of modulating an optical input with a radio frequency (RF) signal to obtain an encoded light signal includes splitting the optical input to a first optical input and a second optical input; traversing a first region and a second region, respectively, with the first optical input and the second optical input; modulating the first optical input with the RF signal in the first region; controlling propagation speed of the RF signal in the first region; controlling RF line impedance in the first region; and controlling an optical loss of the first optical input in the first region.

According to another embodiment, an electro-optical modulator includes a splitter configured to split an optical input to a first optical input and a second optical input; a first region configured to be traversed by the first optical input; a second region configured to be traversed by the second optical input; and a phase modulator in the first region configured to modulate the first optical input with an RF signal and provide a first output. The phase modulator includes n-doped regions and p-doped regions, a majority of the n-doped regions and p-doped regions being arranged interdigitally; and an intrinsic region between each pair of one of the n-doped regions and one of the p-doped regions among the interdigitally arranged ones of the n-doped regions and the p-doped regions, wherein a width of the intrinsic region is controlled to control a propagation speed and line impedance of the RF signal used to modulate the optical input in the modulator, and a width of each of the n-doped regions and each of the p-doped regions is controlled to control an optical loss of the optical input to the modulator.

According to yet another embodiment, a method of forming a phase modulator including forming p-doped regions and n-doped regions, the forming including forming a majority of the p-doped regions and n-doped regions in an interdigitated arrangement; forming an intrinsic region between each set of one of the p-doped regions and one of the n-doped regions among the interdigitally arranged ones of the n-doped regions and the p-doped regions; controlling a width of each of the p-doped regions and each of the n-doped regions to control optical loss of the phase modulator; and controlling a width of the intrinsic region between each one of the p-doped regions and each adjacent one of the n-doped regions among the interdigitally arranged n-doped regions and p-doped regions to control a propagation speed of a radio frequency signal through the phase modulator and line impedance.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 8-13 are cross sectional views illustrating process steps involved in fabricating the phase shifting region of the electro-optic modulator in accordance with exemplary embodiments, in which:

DETAILED DESCRIPTION

As noted above, an EOM facilitates the transmission of data to greater distances via an optical signal. An MZI is an exemplary EOM performing amplitude, phase, frequency, and/or polarization modulation and benefits from impedance and velocity matching in the RF/optical interaction region.

That is, within the MZI, the radio frequency (RF) signal carrying the data must have the same propagation speed as the optical signal (light) to correctly modulate the optical signal. The impedance matching prevents reflection of the RF signal at both the electrical input and at the end of the device. The interaction of the RF and optical signals or the modulation of the optical signal with the RF energy occurs as the signals go through an electro-optic PIN diode (PIN modulator). A PIN diode includes an intrinsic region between the p and n-doped regions. An interdigitated PIN modulator includes n-doped fingers that extend from the n-doped region and are interdigitated with p-doped fingers that extend from the p-doped region. The interdigitated p-doped and n-doped regions define a gap therebetween.

Embodiments of the systems and methods detailed herein relate to controlling the capacitance of the PIN modulator to control RF propagation speed and line impedance, and controlling the size of the dopant regions to effect optical loss. Specifically, as detailed below, the gap between interdigitated p and n-doped regions is controlled to control capacitance, and, for a given gap width and voltage, the narrowness of the p and n-doped fingers is used to control depletion and, thus, optical loss. That is, optical loss is minimized when full depletion of the n-doped and p-doped fingers is achieved. For a given voltage (electric field strength in the gap) and gap width, narrowing the doped regions (fingers) helps achieve more depletion. The voltage available to drive the EOM is based on the particular driver used. A driver may be fabricated on a different chip (and may use a different technology) disposed in a flip-chip arrangement with the EOM. Such a driver may provide higher voltage than an on-chip driver of the EOM, for example. Dopant concentration also affects depletion. This variable is bounded because too low a concentration will degrade the modulation of the optical signal while too high a concentration will prevent sufficient depletion at an attainable narrowness of the fingers.

Figure 1:
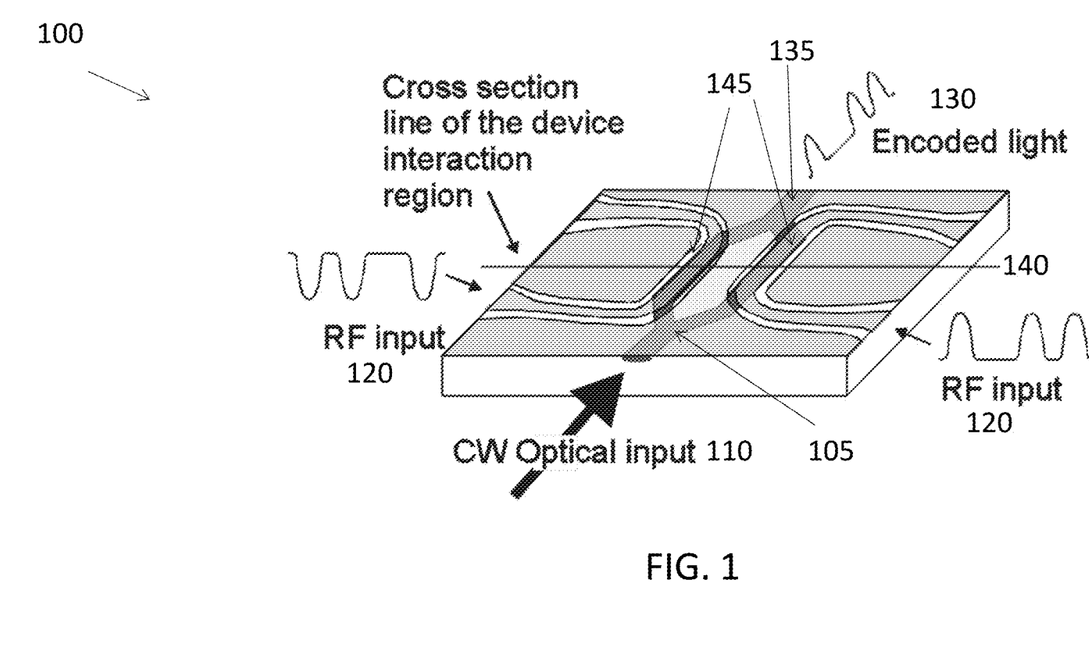
FIG. 1 is an exemplary electro-optic modulator according to an embodiment of the invention.
Figure 2:
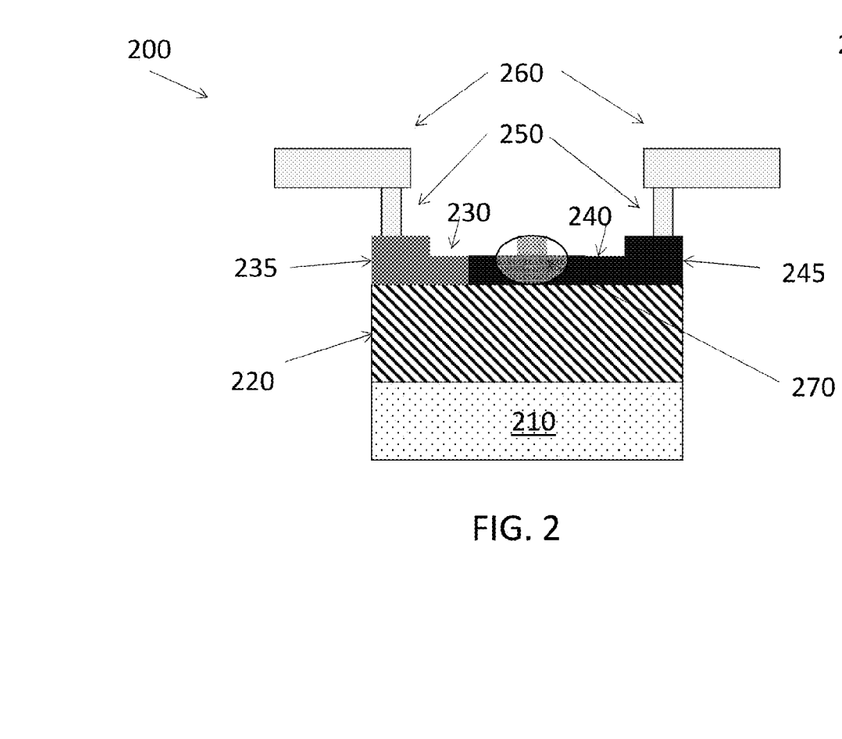
FIG. 2 is a cross-sectional view of the interdigitated modulator in the phase changing region shown in FIG. 1.
Figure 14:
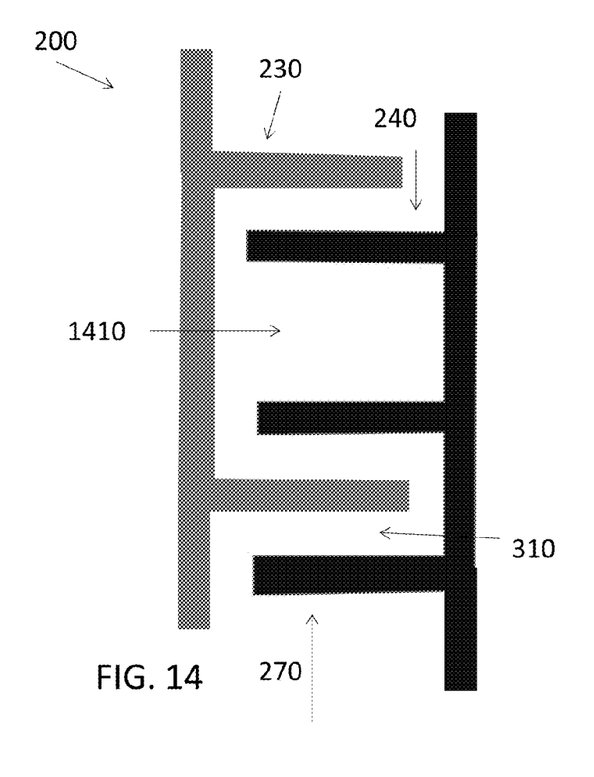
FIG. 14 is a top-down cross-sectional view of the phase changing region shown in FIG. 1 according to an alternate embodiment.

FIG. 1 shows an exemplary electro-optic modulator 100 according to an embodiment of the invention. In the exemplary modulator 100, an optical input 110, which may be a continuous wave signal, is split by a splitter 105. Each resulting optical signal traverses a phase shifting region 145 where RF signals 120 (one being the inverse of the other) are input to each side of the splitter 105 that divides the incoming optical input 110. As noted above, in alternate embodiments, only one of the two sides of the splitter 105 may include a phase shifting region 145. The line 140 indicated as the cross sectional line of the device interaction region (phase shifting region 145) is shown in FIG. 1. This line 140 goes through both phase shifting regions 145. As further discussed below, this phase shifting region 145, according to embodiments of the invention, includes an interdigitated phase modulator 200 (FIG. 2). The interdigitated phase modulator 200 is a reverse biased diode. The RF data signal 120 (or its inverse denoted as data-bar) modulates voltage that is applied to the diode (interdigitated phase modulator 200). FIG. 14, discussed below, illustrates the device 10 including the driver for the electro-optic modulator 100. This voltage affects the carrier density in the diode which, in turn, affects the optical input 110 split into each interdigitated phase modulator 200. Specifically, the voltage-affected carrier density changes the propagation speed of the optical input 110 that is split into the interdigitated phase modulator 105. Optical outputs of each of the interdigitated phase modulators 200 on each side of the splitter 105 are recombined by an interferometer. The interference between the two sides of the split 105 results in the encoded light 130. As noted above, in alternate embodiments, the interdigitated phase modulator 200 may be used on only one side of the splitter 105. In this case, the encoded light 130 is the output of the one interdigitated phase modulator 200 that interferes with the output of the second un-modulated optical signal.

Figure 3:
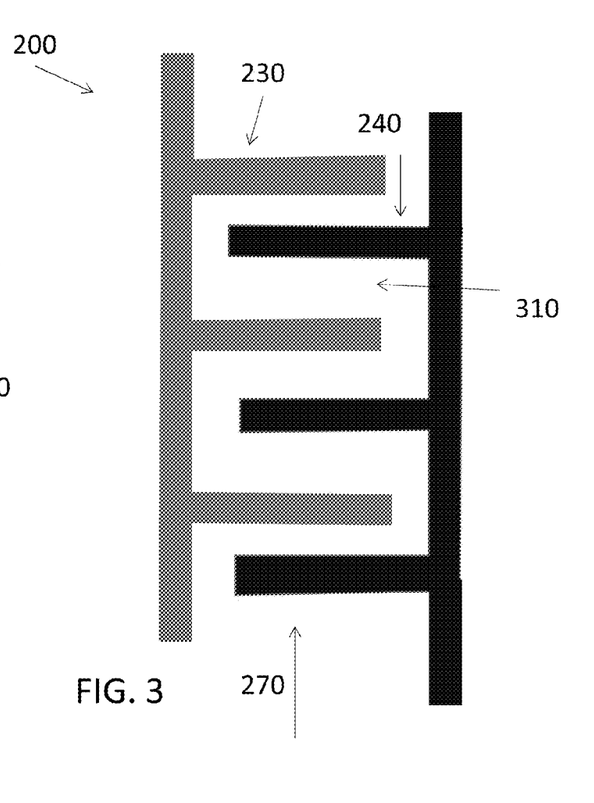
FIG. 3 is a top-down cross-sectional view of the phase changing region shown in FIG. 1.

FIG. 2 is a cross-sectional view of the interdigitated phase modulator 200 in the phase changing region 145 shown in FIG. 1. Because the p-doped region 230 and n-doped region 240 are interdigitated, one is behind the other in the cross-sectional view of FIG. 2 with an intrinsic region 310 in between. This arrangement is shown more clearly in the top-down cross-sectional view of the interdigitated phase modulator 200 in FIG. 3. A silicon substrate 210 is shown with a buried oxide layer 220 above it. The p-doped region 230 and n-doped region 240 are formed in the silicon on the buried oxide layer 220. Contacts 250 and electrodes 260 are formed over the ohmic contacts 235, 245 formed within silicon of the p-doped region 230 and the n-doped region 240. The optical input 110 from the splitter 105 travels in a direction that is perpendicular to the cross sectional line 140 shown in FIG. 1. Thus, the optical input 110 goes into the figure at 270. Based on the width (depth according to the perspective of FIG. 2) of the p-doped region 230 and the n-doped region 240, full depletion of these regions 230, 240 may be achieved. That is, predominantly all carriers may be removed from the regions 230, 240 that are traversed by the optical input 110. Thus, the full depletion would minimize optical path loss of the optical input 110 as it travels along 127 to traverse the phase shifting region 145. The top-down view of FIG. 3 does not include the electrodes 260 or contact vias 250, which would be disposed above the peripheral p-doped region 230 and the n-doped region 240 from which the fingers protrude. FIG. 3 shows only the p-doped region 230 and the n-doped region 240, with the fingers of each interdigitated. The direction of travel of the optical input is indicated by 270. The area between each p-doped finger and n-doped finger along 270 (intrinsic region 310 between the fingers) is the gap of interest with regard to capacitance, as further discussed below.

Figure 4:
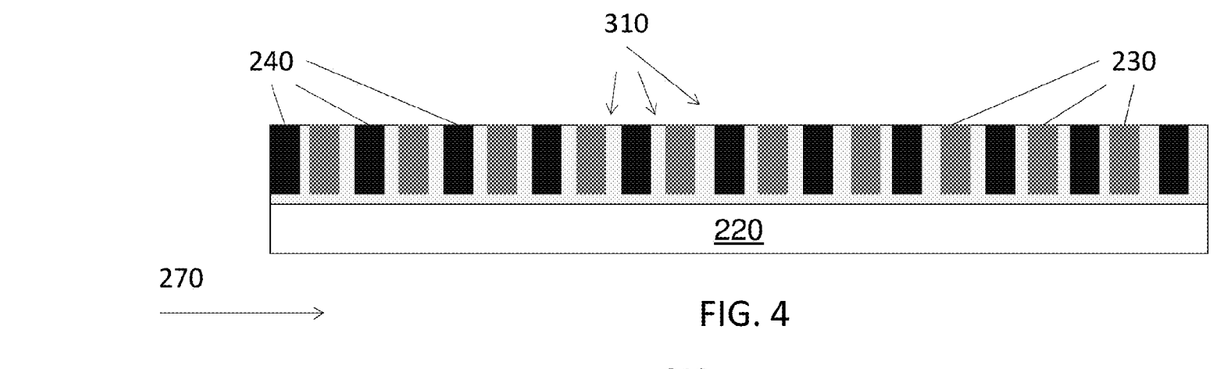
FIG. 4 illustrates an exemplary width of the intrinsic region according to an embodiment of the invention.
Figure 5:
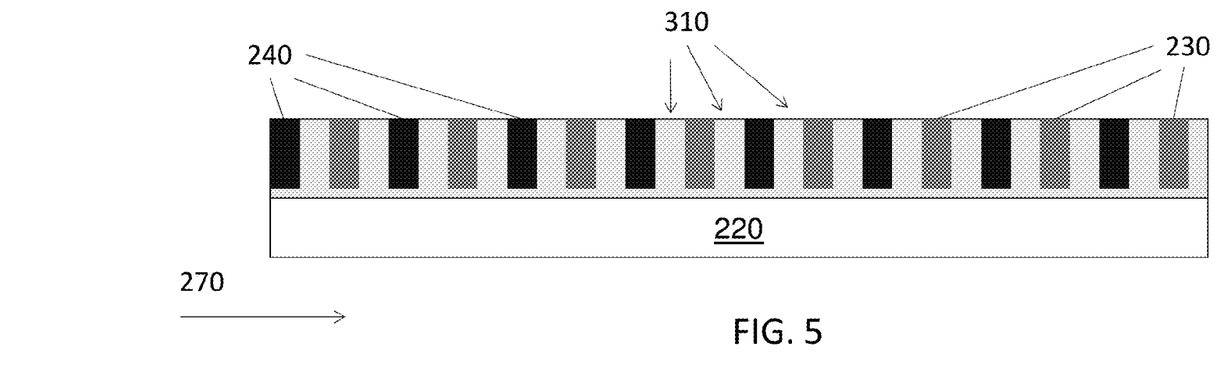
FIG. 5 illustrates another exemplary width of the intrinsic region according to another embodiment of the invention.

FIGS. 4 and 5 illustrate two exemplary widths of the intrinsic region 310 according to embodiments of the invention. FIGS. 4 and 5 are cross sections along 270 as shown in FIG. 3. Thus, the optical input 110 travels in the direction indicated by 270. The p-doped region 230 and n-doped region 240 are shown alternating (interdigitated) over the direction of travel 270 of the optical input 110 with a gap defining the intrinsic region 310 separating the two regions 230, 240. The gap or intrinsic region 310 in FIG. 4 is narrower than the intrinsic region 310 in FIG. 5. The larger the width of the intrinsic region 310 between the p-doped region 230 and the n-doped region 240, the lower the capacitance. And, the lower the capacitance, the higher the propagation speed of the RF signal 120 will be, and also the higher the line impedance of the MZI electrode transmission line. Thus, the arrangement shown in FIG. 5 would result in lower capacitance and, thus, higher propagation speed for the RF signal 120 than the arrangement shown in FIG. 4. Also, the arrangement in FIG. 5 would result in a higher RF line impedance than the arrangement in FIG. 4. Higher RF line impedance means that the MZI electrode transmission line can have a higher voltage and lower current. By controlling the width of the intrinsic region 310 between the p-doped region 230 and the n-doped region 240, the RF propagation speed may be controlled (sped up or slowed down) as needed, and the RF line impedance can correspondingly be increased or decreased. The larger intrinsic region 310 (e.g., on the order of 50 nanometers or greater) also mitigates the need for a direct current (DC) bias to prevent electrons and holes from mixing within the PIN-junction when the RF signal 120 swings slightly into a positive bias across the junction, and allows an RF signal 120 that is centered at 0 volts to be applied to the diode of the interdigitated phase modulator 200. Not needing to apply a DC bias, or using a minimal DC offset, with the RF signal 120 can reduce the power consumption.

Figure 6:
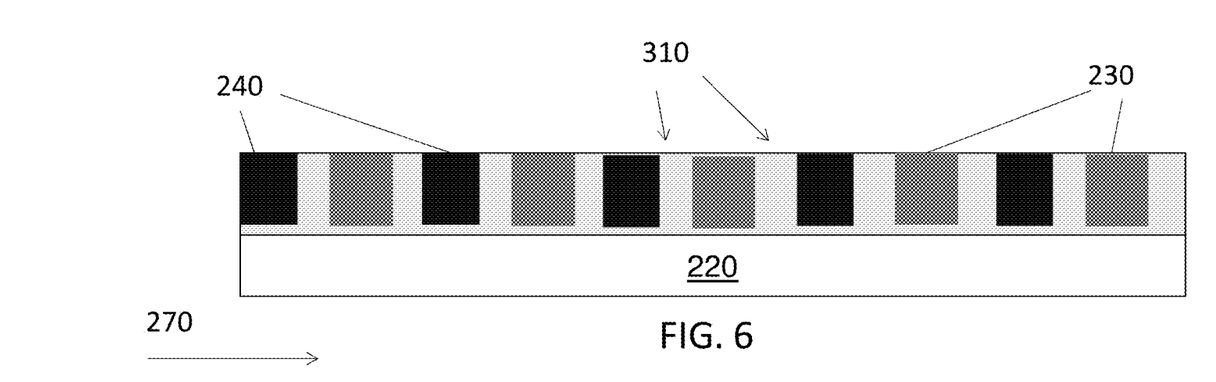
FIG. 6 illustrates an exemplary width of the doped regions according to an embodiment of the invention.
Figure 7:
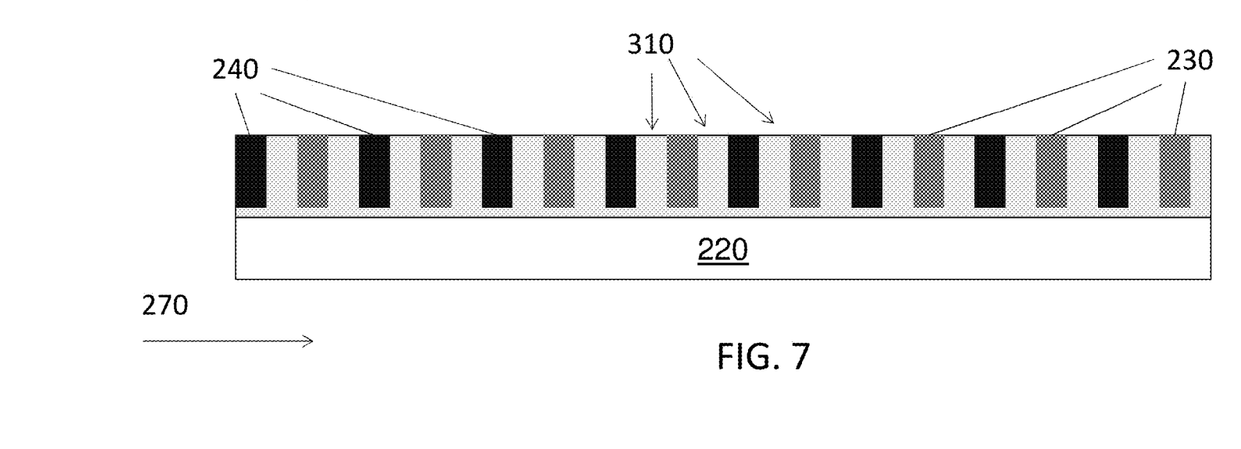
FIG. 7 illustrates another exemplary width of the doped regions according to another embodiment of the invention.

FIGS. 6 and 7 illustrate two exemplary widths of the doped regions 230, 240 according to embodiments of the invention. FIGS. 6 and 7, like FIGS. 4 and 5, are cross sections along 270 as shown in FIG. 3. The optical input 110 travels in the direction indicated by 270. The width of the p-doped region 230 and the n-doped region 240 is wider in FIG. 6 as compared with the width of the p-doped region 230 and the n-doped region 240 in FIG. 7. The gap (intrinsic region 310) between the p-doped region 230 and the n-doped region 240 may be the same (or different) in FIGS. 6 and 7. For a given (same) gap and doping concentration in both FIGS. 6 and 7, the narrower fingers (p-doped region 230 and n-doped region 240 shown in FIG. 7) are more fully depleted than the wider fingers shown in FIG. 6. The higher the depletion along 270, the lower the optical loss experienced by optical input 110 being modulated in the phase shifting region 145 and, thus, the lower the optical loss for the encoded light 130. Thus, according to the arrangement shown for FIGS. 6 and 7, FIG. 7 would result in reduced optical loss.

Figure 8:
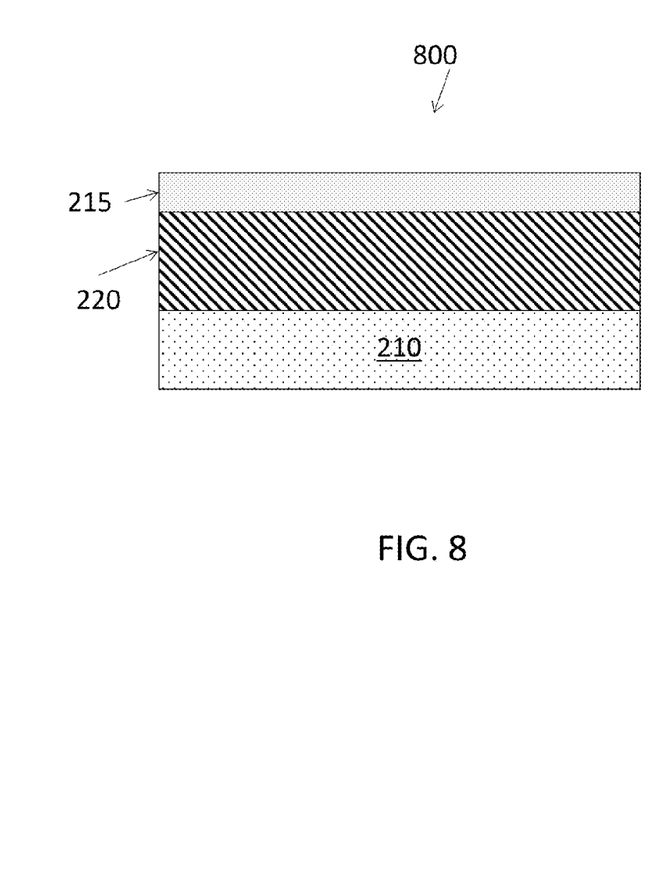
FIG. 8 illustrates a cross-sectional view of an intermediate structure with an etched SOI formed on a buried oxide.
Figure 9:
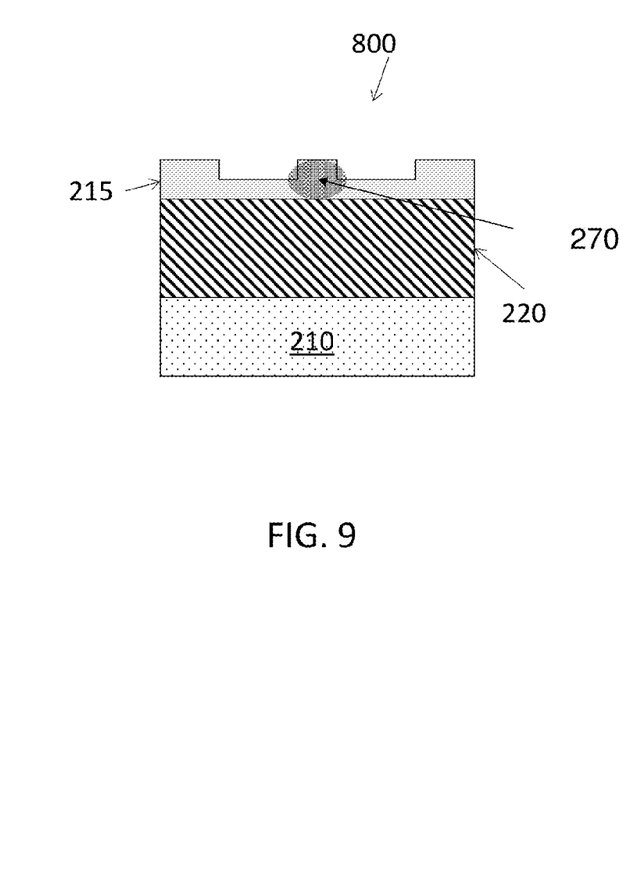
FIG. 9 illustrates a different perspective of a cross section of the intermediate structure shown in FIG. 8.
Figure 10:
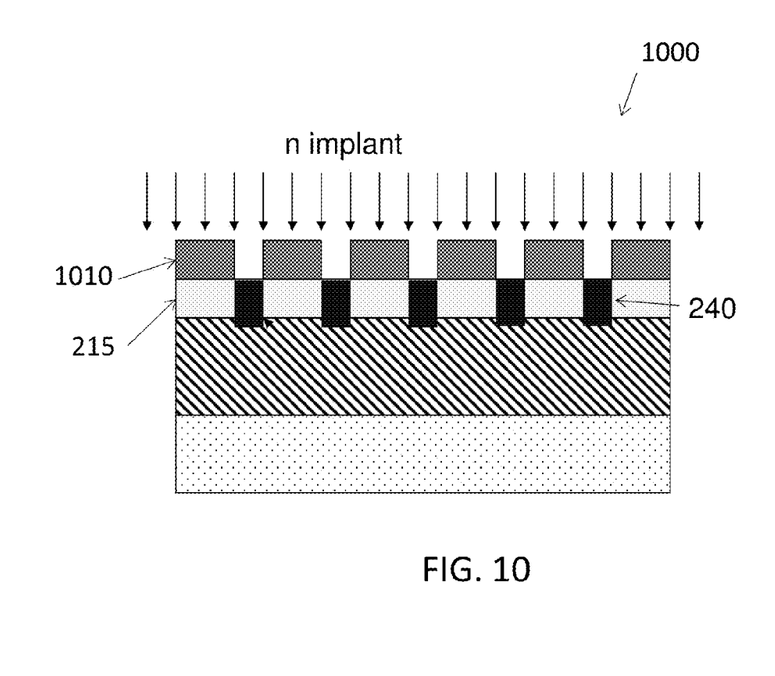
FIG. 10 shows a cross-sectional view of implantation of the n-type material to form the n-doped region in another intermediate structure.
Figure 11:
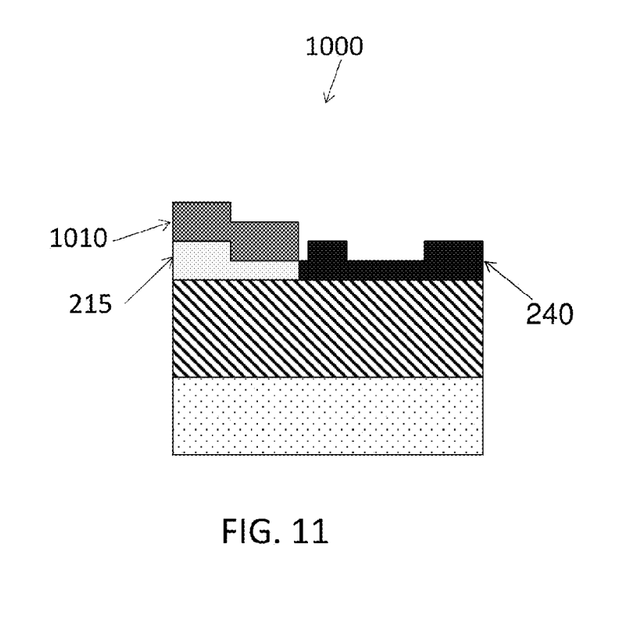
FIG. 11 shows a different perspective of a cross section of the intermediate structure shown in FIG. 10.

FIGS. 8-13 are cross-sectional views illustrating process steps involved in fabricating the phase shifting region 145 of the electro-optic modulator 100 according to embodiments of the invention. The intermediate structure 800 shown in FIG. 8 is a cross-sectional view along the phase shifting region 145 (along 270). An etched silicon-on-insulator (SOI) layer 215 is formed on the buried oxide layer 220, which is formed on the substrate 210. A cross-sectional view of the same structure 800 across the phase shifting region 145 is shown in FIG. 9. The etched regions of the SOI layer 215 are visible in the view of FIG. 9. The etching of the SOI layer 215 can be achieved by known photolithographic techniques. FIG. 10 illustrates an intermediate structure 1000 that results from a photosensitive material 1010 being patterned over the SOI layer 215 followed by implantation of n-type material (e.g., phosphorous) to produce the n-doped region 240. The photosensitive material 1010 defines a line and/or a gap through the photolithographic processing. The critical dimension may be width around 200 nanometers (nm), for example. The cross-sectional view of the same structure 1000 in FIG. 11 shows that the n-doped region 240 is formed on one side of the structure 1000. That is, the cross-sectional view in FIG. 11 is across the phase shifting region 145. Thus, as indicated by the top-down view of FIG. 3, the other side of the structure 1000 (the back side according to the view of FIG. 10) must be protected by the photosensitive material 1010 based on the patterning to prevent implantation of n-type material all the way across the structure 1000. As FIG. 10 indicates, controlling the patterning of the photosensitive material 1010 facilitates controlling the width of the n-doped region 240.

Figure 12:
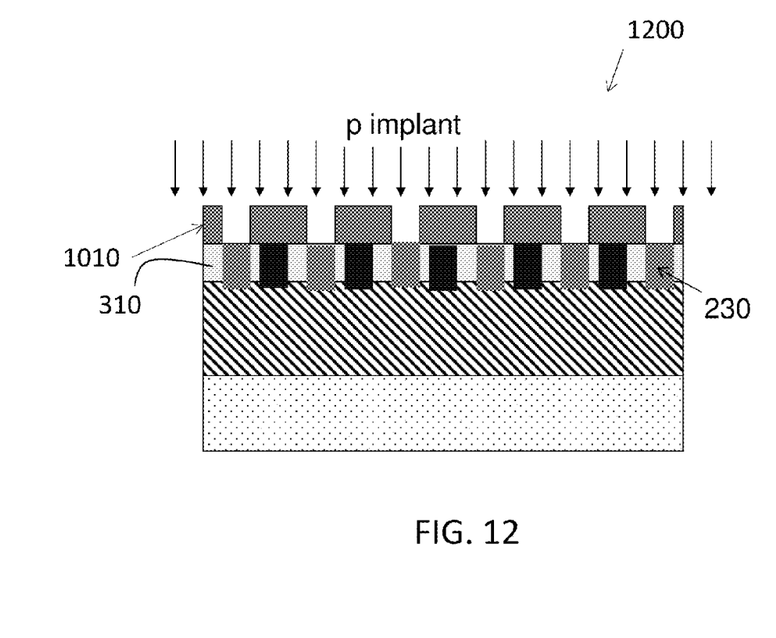
FIG. 12 shows a cross-sectional view of implantation of the p-type material to form the p-doped region in another intermediate structure.
Figure 13:
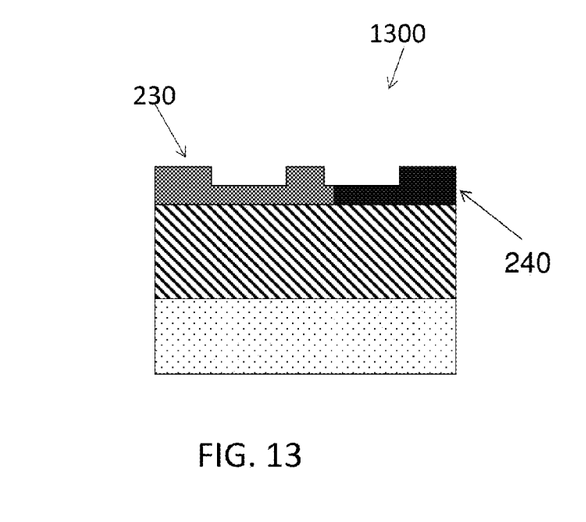
FIG. 13 shows a different perspective of a cross section of the intermediate structure shown in FIG. 12 with the photosensitive material removed.

FIG. 12 illustrates an intermediate structure 1200 that results from patterning photosensitive material 1010 over the n-doped region 240 and implanting p-type material (e.g., boron) to produce the p-doped region 230. The structure 1300 resulting from removal of the photosensitive material 1010 is shown in FIG. 13. The view in FIG. 13 is a cross-sectional view across the phase shifting region 145. Thus, according to the top-down view in FIG. 3, the p-doped region 230 and the n-doped region 240 are not side-by-side but, instead, one behind the other with the intrinsic region 310 between the two. That is, the SOI 215 between the p-doped region 230 and the n-doped region 240 is the intrinsic material 310. As FIG. 12 indicates, controlling the patterning of the photosensitive material 1010 facilitates controlling the width of the p-doped region 230. Further, controlling the patterning also facilitates controlling the width of the intrinsic material 310 or the distance between adjacent p-doped and n-doped regions 230, 240. The RF line impedance of the structure 1300 shown in FIG. 13 is predominantly determined by the line capacitance of the PIN junction that has been formed by the processing described above. By controlling the width of the p-doped, n-doped, and intrinsic regions 230, 240, 310 between the n and p doping, the line capacitance of the electro-optic PIN junction is controllably defined. The implantation of ohmic contacts prior to formation of the contacts 250 and electrodes 260 completes the processing.

FIG. 14 is a top-down cross-sectional view of the phase changing region 145 shown in FIG. 1 according to a different embodiment than the one discussed with reference to FIG. 3. As noted above, the interdigitated arrangement of the p-doped region 230 and n-doped region 240 defines a gap between each set of fingers (each p-doped region 230 and n-doped region 240 pair) and, for a given gap width and voltage, narrowing the fingers facilitates full depletion of the doped regions. As also noted above in the comparison of FIGS. 4 and 5, for example, an increase in the gap (intrinsic region 310) between the p-doped region 230 and the n-doped region 240 results in reduced capacitance. The embodiment illustrated by FIG. 14 is a compromise between the interdigitated arrangement to achieve full depletion and the increased gap to reduce capacitance. Specifically, one n-doped region 230 "finger," as shown in FIG. 14, or one p-doped region "finger" or both may be omitted periodically or non-periodically over the length of the interdigitated phase modulator 200 (along line 270). In the extreme case, the entirety of the p-doped fingers (230) or n-doped fingers (240) may be removed. As FIG. 14 indicates, the omission of one of the p-doped fingers (230) increases the gap (e.g., 1410, shown in FIG. 14) as compared with the regular gap indicated by the intrinsic region 310 between interdigitated p-doped regions 230 and n-doped regions 240. The width of the gap 1410 is defined by the p-doped region 230 and the n-doped region 240 from which the fingers protrude and is wider than the intrinsic region indicated by 310. While this increased gap 1410 results in a reduction of the capacitance, the retention of the interdigitated arrangement over the majority of the phase shifting region 145 facilitates the depletion needed to minimize optical loss.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of modulating an optical input with a radio frequency (RF) signal to obtain an encoded light signal, the method comprising:

splitting the optical input to a first optical input and a second optical input;

traversing a first region and a second region, respectively, with the first optical input and the second optical input;

traversing only one path with the RF signal, the path including the first region;

modulating the first optical input with the RF signal in the first region;

controlling propagation speed of the RF signal in the first region;

controlling RF line impedance in the first region; and controlling an optical loss of the first optical input in the first region.

2. The method according to claim 1, further comprising obtaining the encoded light signal based on an interference among a first output of the first region and a second output of the second region.

3. The method according to claim 1, wherein the modulating the first optical input with the RF signal includes using an interdigitated phase modulator in the first region.

4. The method according to claim 3, wherein the controlling the propagation speed of the RF signal includes controlling a gap between adjacent n-doped and p-doped regions of the interdigitated phase modulator.

5. The method according to claim 4, wherein the controlling the gap to decrease the gap results in slower propagation of the RF signal, and the controlling the gap to increase the gap results in faster propagation of the RF signal.

6. The method according to claim 3, wherein the controlling the optical loss includes controlling a width of n-doped and p-doped regions of the interdigitated phase modulator.

7. The method according to claim 6, wherein the controlling the width of the n-doped and p-doped regions to be narrower results in a decrease in the optical loss.

8. The method according to claim 1, wherein the modulating the first optical input with the RF signal includes using a phase modulator in the first region with n-doped regions and p-doped regions that are interdigitated over a majority of the first region.

9. The method according to claim 8, wherein n-doped regions and p-doped regions that are not interdigitated include a larger gap therebetween.

10. The method according to claim 1, further comprising modulating the second optical input with an inverse of the RF signal in the second region.

* * * * *